(12) United States Patent
Park et al.

(10) Patent No.: US 9,972,781 B2
(45) Date of Patent: May 15, 2018

(54) METHOD OF MANUFACTURING MASK AND METHOD OF MANUFACTURING DISPLAY DEVICE

(71) Applicant: SAMSUNG DISPLAY CO., LTD., Yongin-si, Gyeonggi-do (KR)

(72) Inventors: Je Hyeong Park, Seoul (KR); Kyung-Bae Kim, Seoul (KR); Byeong-Beom Kim, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/084,260

(22) Filed: Mar. 29, 2016

(65) Prior Publication Data

US 2016/0322573 A1  Nov. 3, 2016

(30) Foreign Application Priority Data

Apr. 30, 2015  (KR) ........................ 10-2015-0062068

(51) Int. Cl.
| | |
|---|---|
| *H01L 51/00* | (2006.01) |
| *H01L 51/56* | (2006.01) |
| *H01L 51/52* | (2006.01) |
| *H01L 27/32* | (2006.01) |
| *G03F 1/68* | (2012.01) |
| *G03F 1/54* | (2012.01) |
| *G03F 7/004* | (2006.01) |

(Continued)

(52) U.S. Cl.
CPC ............ *H01L 51/0018* (2013.01); *G03F 1/54* (2013.01); *G03F 1/68* (2013.01); *G03F 7/0043* (2013.01); *G03F 7/2016* (2013.01); *G03F 7/2018* (2013.01); *G03F 7/40* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 51/5253* (2013.01); *H01L 51/56* (2013.01); *H01L 51/0023* (2013.01); *H01L 2227/323* (2013.01)

(58) Field of Classification Search
CPC ....... H01L 51/0018; G03F 1/76; G03F 7/0007
See application file for complete search history.

(56) References Cited

U.S. PATENT DOCUMENTS

| | | |
|---|---|---|
| 3,837,855 A | 9/1974 | Rousseau et al. |
| 3,885,076 A | 5/1975 | Heidenreich et al. |
| 5,821,017 A | 10/1998 | Thomson et al. |

(Continued)

FOREIGN PATENT DOCUMENTS

| | | |
|---|---|---|
| EP | 1901117 | 3/2006 |
| JP | 58-182231 | 10/1983 |

(Continued)

OTHER PUBLICATIONS

European Search Report dated Oct. 7, 2016 in corresponding EP Applicatin No. 16167479.1.

*Primary Examiner* — Selim Ahmed
*Assistant Examiner* — Evan Clinton
(74) *Attorney, Agent, or Firm* — F. Chau & Associates, LLC

(57) ABSTRACT

Provided is a method of manufacturing a mask including preparing a support plate, forming a light blocking layer on the support plate, curing a predetermined region of the light blocking layer, and removing other region of the light blocking layer, excluding the predetermined region.

23 Claims, 20 Drawing Sheets

(51) Int. Cl.
 *G03F 7/20* (2006.01)
 *G03F 7/40* (2006.01)

(56) References Cited

U.S. PATENT DOCUMENTS

| | | |
|---|---|---|
| 6,783,898 B2 | 8/2004 | Berkey et al. |
| 7,894,921 B2 | 2/2011 | John et al. |
| 7,901,842 B2 | 3/2011 | Yamada et al. |
| 8,003,040 B2 | 8/2011 | El-Siblani |
| 8,110,135 B2 | 2/2012 | El-Siblani |
| 8,523,555 B2 | 9/2013 | Kim et al. |
| 2004/0191641 A1 | 9/2004 | Ray et al. |
| 2009/0029266 A1 | 1/2009 | Schenker et al. |
| 2009/0166612 A1 | 7/2009 | Cain et al. |
| 2009/0256984 A1* | 10/2009 | Lee .................. G02F 1/136209 349/43 |
| 2009/0266582 A1* | 10/2009 | Sakurai ................. H05K 3/207 174/250 |
| 2011/0003418 A1* | 1/2011 | Sakata ............. H01L 21/02554 438/34 |
| 2011/0052180 A1* | 3/2011 | Pei ......................... G02B 5/003 396/439 |
| 2012/0208125 A1 | 8/2012 | Hatakeyama |
| 2013/0070222 A1 | 3/2013 | Fujimura |
| 2013/0075734 A1 | 3/2013 | Cain et al. |
| 2013/0078796 A1 | 3/2013 | Ganesan et al. |
| 2013/0089815 A1 | 4/2013 | Anderson et al. |
| 2013/0181435 A1 | 7/2013 | Hersch et al. |
| 2013/0224636 A1 | 8/2013 | Kobrin |
| 2014/0220313 A1* | 8/2014 | Kim ....................... G02B 5/201 428/195.1 |
| 2015/0093687 A1 | 4/2015 | Kim et al. |
| 2016/0048073 A1* | 2/2016 | Lee ........................... G03F 1/74 430/5 |
| 2016/0066456 A1* | 3/2016 | Min ..................... H05K 5/0017 428/172 |

FOREIGN PATENT DOCUMENTS

| | | |
|---|---|---|
| JP | 3168091 | 3/2001 |
| JP | 2007-165362 | 6/2007 |
| JP | 2012-241261 | 12/2012 |
| KR | 1020020087250 | 11/2002 |
| WO | 2004038504 A2 | 5/2004 |

* cited by examiner

METHOD OF MANUFACTURING MASK AND METHOD OF MANUFACTURING DISPLAY DEVICE

CROSS-REFERENCE TO RELATED APPLICATION

This application claims priority to and the benefit of Korean Patent Application No. 10-2015-0062068 filed in the Korean Intellectual Property Office on Apr. 30, 2015, the entire contents of which are incorporated by reference herein.

TECHNICAL FIELD

The present disclosure relates to a display device, and more particularly, to a method of manufacturing a mask and a method of manufacturing a display device.

DISCUSSION OF THE RELATED ART

Examples of display devices include a liquid crystal display (LCD), a plasma display panel (PDP), an organic light emitting display (OLED), a field effect display (FED), an electrophoretic display, and the like.

In particular, organic light emitting display devices include two electrodes and an organic light emitting layer interposed therebetween. Electrons injected from one electrode and holes injected from the other electrode are combined in the organic light emitting layer to form excitons, and as the excitons release energy, light is emitted.

Unlike a liquid crystal display, organic light emitting display devices are self-luminous and therefore do not require a light source. For this reason, OLEDs may be less thick and may weigh less than LCDs. Also, OLEDs may exhibit high quality characteristics such as low power consumption, high luminance, and a fast response speed. These characteristics have permitted organic light emitting display devices to come to prominence as next-generation display devices.

An organic light emitting display includes various conductive lines which may be made of metal. A desired pattern of metal lines is formed by forming a metal layer on a substrate, forming a mask pattern on the metal layer, and performing etching thereon to remove the portions of the metal layer that were not masked by the formed mask pattern.

Here, the mask pattern is formed by thinly applying photoresist on the metal layer, placing a desired photo mask on the photoresist, and applying light through the mask to the photoresist.

The photo mask is formed through a process illustrated in FIG. 1. A light blocking layer 3 and a photoresist 5 are sequentially stacked on a quartz substrate 1 (please refer to FIG. 1(A)). Next, the photoresist 5 is irradiated using a light source 7 (as shown in FIG. 1(B)), and a developing and etching process is performed thereon to form the pattern illustrated in FIG. 1(C). Thereafter, the etched photoresist 5(a) is removed, manufacturing a photo mask with the desired light blocking layer pattern 3(a) formed thereon.

However, the photo mask manufactured through the foregoing process incurs high manufacturing cost and takes a great amount of time.

The above information disclosed in this section is only for enhancement of understanding of the related art and therefore it may contain information that is not prior art.

SUMMARY

The present invention provides a method of manufacturing mask having a reduced manufacturing cost and manufacturing time.

The present invention provides a method of manufacturing a display device having a reduced cost and time for manufacturing an etch mask applied to form metal lines.

An exemplary embodiment of the present invention provides a method of manufacturing a mask, including preparing a support plate, forming a light blocking layer on the support plate, curing a predetermined region of the light blocking layer, and removing other region of the light blocking layer, excluding the predetermined region.

The forming of the light blocking layer and the curing of the light blocking layer may be repeatedly performed.

The method may further include forming a passivation layer on the support plate before the forming of the light blocking layer. The passivation layer may prevent heat from being generated when the light blocking layer is cured from being transmitted to the support plate.

The passivation layer may be any one of a silicon nitride film, a silicon oxide layer, and a silicon oxynitride layer.

In the forming of the light blocking layer, the light blocking layer may be formed by applying a light blocking material to the support plate.

The light blocking material may be formed of chromium (Cr) or a chromium oxide (e.g. CrO, $Cr_2O_3$, $CrO_3$, $CrO_5$, etc.).

The light blocking material may be applied to the support plate by a roller or a doctor blade.

The curing of the light blocking layer may be performed by irradiating the predetermined region of the light blocking layer with a laser.

In the removing of the light blocking layer, the other region of the light blocking layer may be separated from the predetermined region of the light blocking layer by jetting air thereto. The support plate may be light-transmissive.

An exemplary embodiment of the present invention provides a method of manufacturing a mask, including preparing a support plate, applying a light blocking material with a predetermined pattern on the support plate, and curing the light blocking material.

The applying of the light blocking material and the curing of the light blocking material may be repeatedly performed.

The light blocking material may be formed of chromium (Cr) or a chromium oxide.

An exemplary embodiment of the present invention provides a method of manufacturing a display device, including preparing a substrate, forming an insulating layer on the substrate, forming a metal layer on the insulating layer, forming a light blocking layer on the metal layer, curing a predetermined region of the light blocking layer, removing other region of the light blocking layer, excluding the predetermined region, and etching the metal layer such that the insulating layer is exposed. The metal layer is etched using the predetermined region of the light blocking layer as a mask.

The forming of the light blocking layer and the curing of the light blocking layer may be repeatedly performed.

The method may further include forming a passivation layer on the metal layer before the forming of the light blocking layer. The passivation layer may prevent heat generated when the light blocking layer is cured from being transmitted to the metal layer.

The passivation layer may be any one of a silicon nitride film, a silicon oxide layer, and a silicon oxynitride layer.

In the forming of the light blocking layer, the light blocking layer may be formed by applying an etch-resistant material to the metal layer.

In the removing of the light blocking layer, the other region of the light blocking layer may be separated from the predetermined region of the light blocking layer by jetting air thereto. The method may further include removing the predetermined region of the light blocking layer.

According a method for manufacturing a mask of an exemplary embodiment of the present invention, since the process of thinly forming a light blocking layer and curing the light blocking layer to have a predetermined pattern is repeatedly performed to manufacture a mask, manufacturing cost may be significantly reduced and manufacturing time and process may be simplified, compared with the related art process of manufacturing a photo mask through photolithography.

Also, according to a method for manufacturing a display device of an exemplary embodiment of the present invention, since lines are formed by manufacturing an etch mask through a process of forming a light blocking layer and curing the light blocking layer to have a predetermined pattern, similar to the method of manufacturing a mask, cost and time required for forming the metal lines may be reduced.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
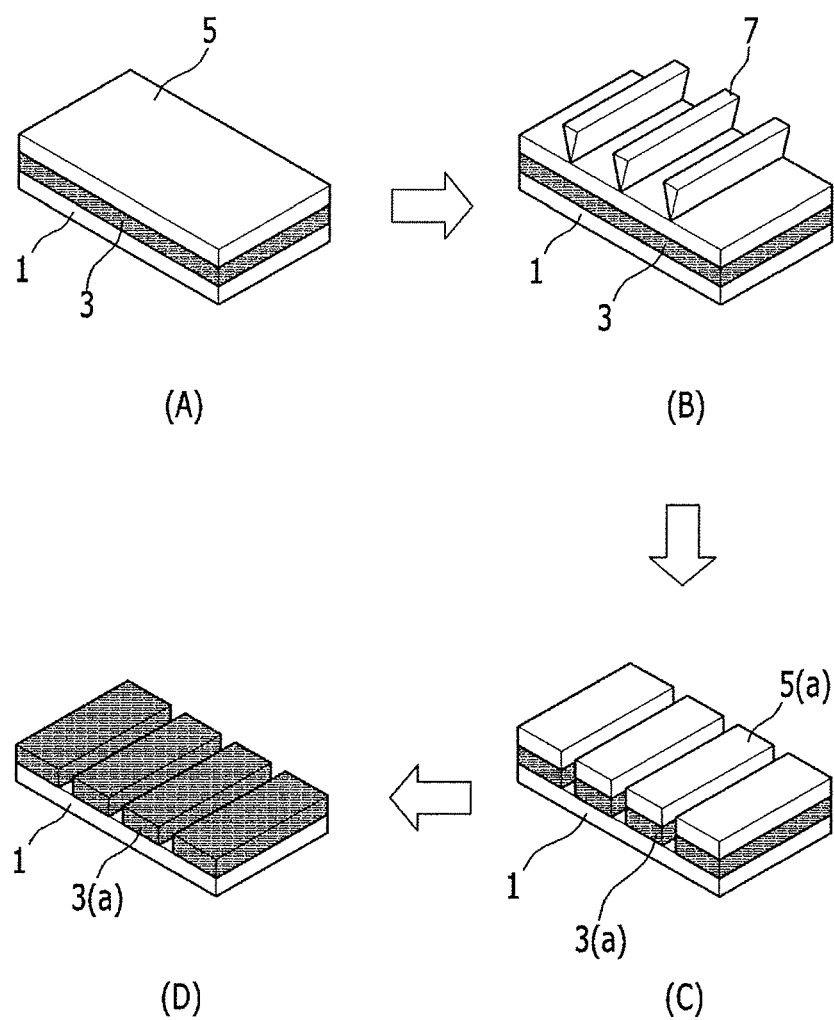
FIG. 1 is a schematic diagram illustrating a process of manufacturing a mask.

Embodiments will be described in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, thicknesses of layers and regions may be exaggerated for clarity of the specification. When a layer is referred to as being "on" another layer or substrate, the layer may be directly formed on the other layer or substrate or indirectly formed with an intervening layer therebetween. Throughout the specification, like reference numerals may refer to like elements.

In manufacturing a mask according to an exemplary embodiment of the present invention, a process of forming a light blocking layer on a light-transmissive support plate and a process of curing the formed light blocking layer to have a predetermined pattern are repeated. A remaining light blocking layer other than the cured pattern is removed to form a mask.

First, a mask manufacturing apparatus for manufacturing a mask through the afore-mentioned mask manufacturing method will be briefly described with reference to FIG. 2

Figure 2:
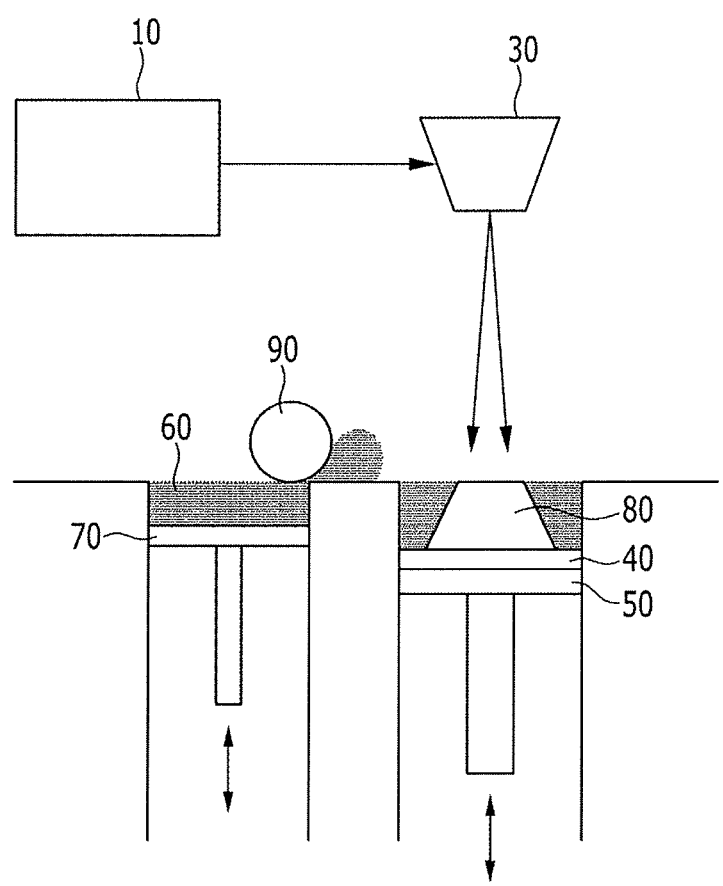
FIG. 2 is a schematic diagram illustrating an apparatus of manufacturing a mask according to an exemplary embodiment of the present invention.

Referring to FIG. 2, the mask manufacturing apparatus includes first and second transfer units 50 and 70, a light source 10, a scanner 30, and a roller 90.

Here, the first transfer unit 50 moves a light-transmissive support plate 40 in a vertical direction. When a light blocking layer 80 is formed on the light-transmissive support plate 40 and the light blocking layer 80 is cured by the scanner 30, the first transfer unit 50 moves the light-transmissive support plate 40 upwardly.

The second transfer unit 70 is disposed to be adjacent to the first transfer unit 50. The second transfer unit 70 transfers a light blocking material 60 used for forming the light blocking layer 80 in a vertical direction.

Here, the roller 90 moves the blocking material 60 positioned on the second transfer unit 70 toward the first transfer unit 50. Here, a doctor blade may also be used instead of the roller 90.

Thereafter, the second transfer unit 70 transfers the blocking material 60 upwardly.

The scanner 30 directs beams of light from the light source 10, for example, a laser, to the light blocking layer on the light-transmissive support plate 40. The scanner 30 irradiates a predetermined region of the light blocking layer 80. Here, the predetermined region of the light blocking layer 80 is formed as a mask pattern.

Hereinafter, a method of manufacturing a mask according to an exemplary embodiment will be described with reference to FIGS. 3 through 12.

Figure 3:
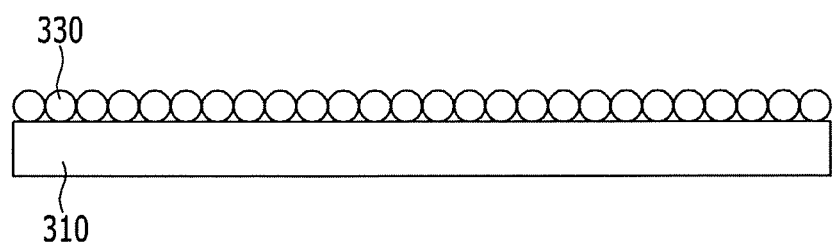
FIGS. 3 through 12 are schematic diagrams illustrating a sequential process of a method of manufacturing a mask according to an exemplary embodiment of the present invention.

Referring to FIG. 3, first, a support plate 310 is prepared. The support plate 310 supports a mask pattern and allows a light, which has selectively passed through the mask pattern, to be transmitted therethrough.

Accordingly, the support plate 310 may be light-transmissive. For example, the support plate 310 may be formed of quartz, or the like. However, a material used to form the support plate 310 is not limited thereto and the support plate 310 may be formed of various known materials used to form a light-transmissive support plate of a photo mask.

Next, a light blocking layer 330 is formed on the support plate 310. The light blocking layer 330 is formed by thinly applying a powdery light blocking material.

As illustrated in FIG. 3, the light blocking material is thinly applied to the support plate 310 using a roller or a doctor blade (not shown).

Here, the light blocking material may be formed as an organic material including chromium (Cr), a chromium oxide (e.g. CrO, Cr2O3, CrO3, CrO5, etc.), or carbon (C). However, the light blocking material is not limited thereto and various known materials used as a light blocking material of a photo mask may be used.

Figure 4:
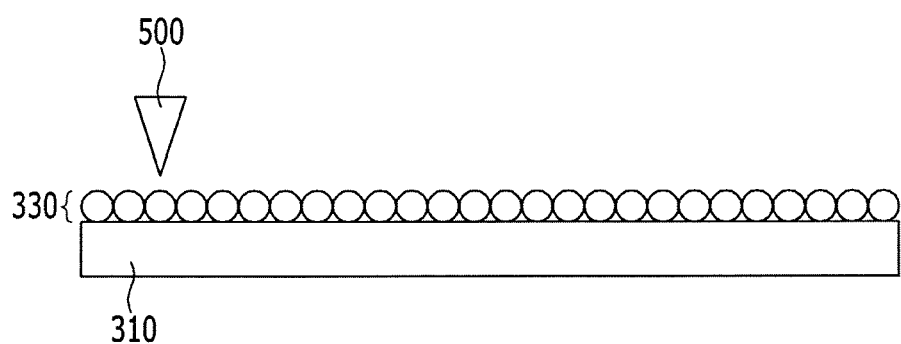

Thereafter, as illustrated in FIG. 4, a predetermined region of the light blocking layer 330 is cured using a light source 500. Here, during the process of curing the light blocking layer 330, a light beam is used to cure the predetermined region of the light blocking layer 330.

Here, a laser or an electronic beam may be used as the light source 500. However, the light source 500 is not limited thereto and various known light sources capable of curing the light blocking material may be used. Hereinafter, a case where the light blocking material is cured by a laser will be described as an example.

A temperature of the light source 500 is varied depending on a melting point of the light blocking material forming the light blocking layer. For example, when the light blocking material is chromium, the temperature created by the light source 500 may be approximately 1900° C., a melting point of chromium.

The predetermined region of the light blocking layer 330 is a region corresponding to a mask pattern when the mask manufacturing process is completed. For example, the predetermined region may correspond to a region of the photo mask for blocking light.

Figure 5:
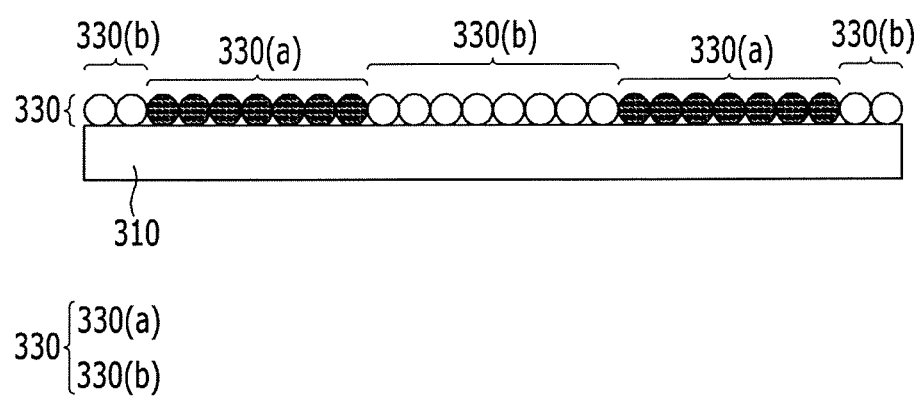

In detail, referring to FIG. 5, when chromium is used as a light blocking material, chromium is melted and cured in predetermined regions 330(a) which has been irradiated by a laser. In contrast, the other regions 330(b) of the light blocking layer 330 that have not been irradiated by the laser are not cured. For example, the regions 330(b) of the light blocking layer 330 which have not been irradiated by the laser remain in a powder state.

According to an exemplary embodiment of the present invention, the process of forming the light blocking layer and the process of curing the light blocking layer are repeatedly performed. For example, the process of forming the light blocking layer, curing the predetermined regions, forming the light blocking layer, and curing the predetermined regions is repeatedly performed.

Figure 6:
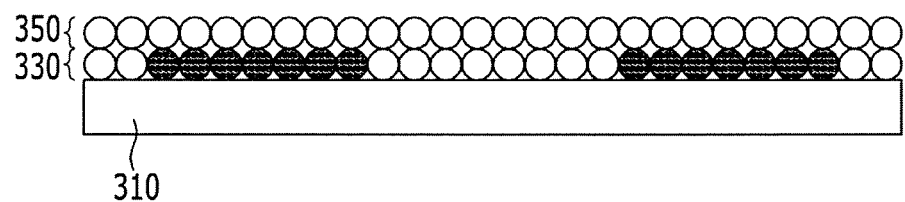

Referring to FIG. 6, a light blocking layer 350 is formed on the light blocking layer 330. As described above, a new light blocking material is thinly applied over the original light blocking layer 330.

Figure 7:
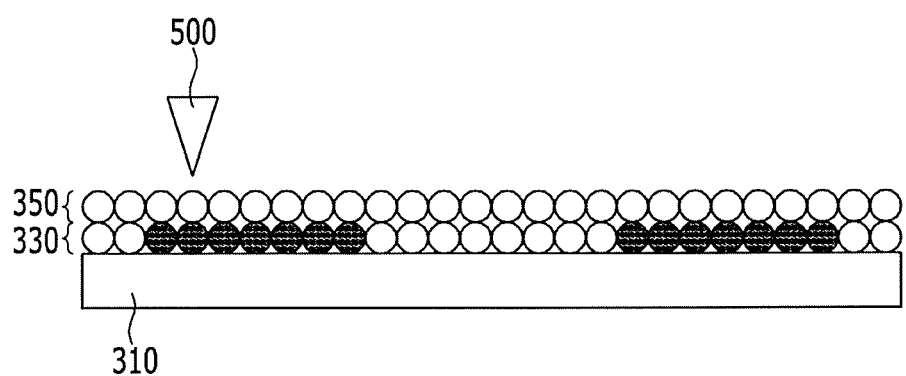

Thereafter, as illustrated in FIG. 7, predetermined regions of the light blocking layer 350 are cured using the light source 500.

Figure 8:
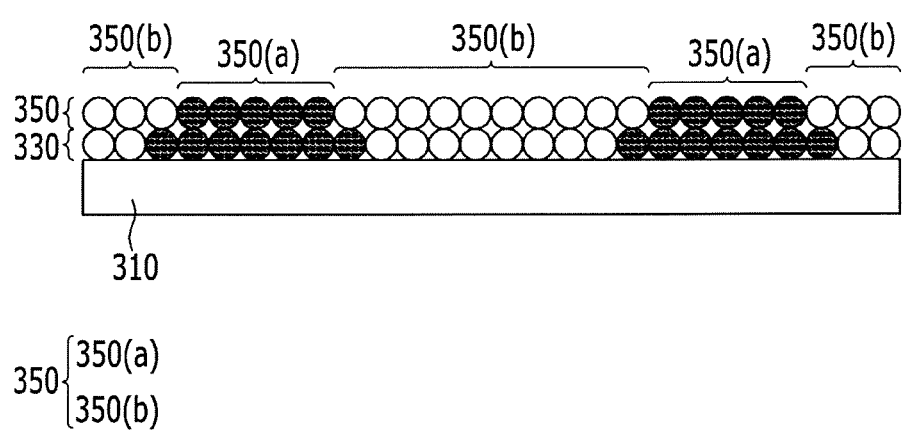

Referring to FIG. 8, predetermined regions 350(a) which have been irradiated by the laser are cured, and regions 350(b) which have not been irradiated are not cured.

Figure 9:
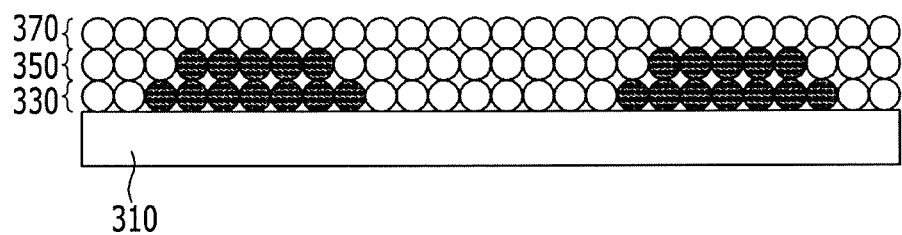

Repeatedly, as illustrated in FIG. 9, an additional light blocking layer 370 is formed on the light blocking layer 350. As described above, a light blocking material is thinly applied over the last light blocking layer 350.

Figure 10:
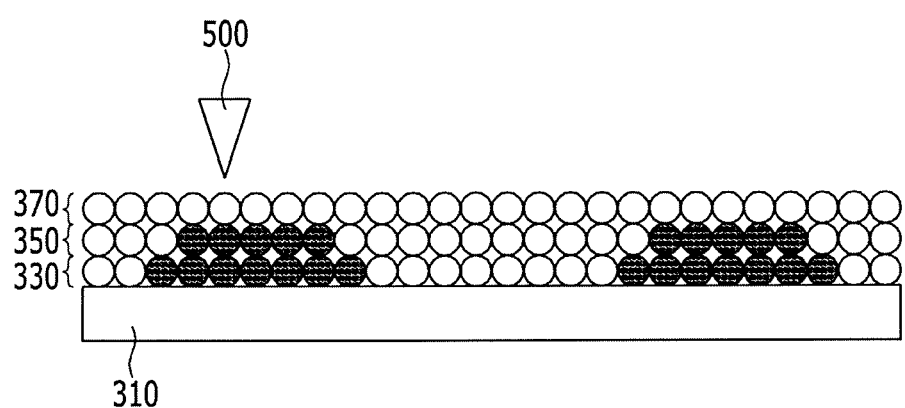

Thereafter, as illustrated in FIG. 10, predetermined regions of the light blocking layer 370 are cured using the light source 500.

Figure 11:
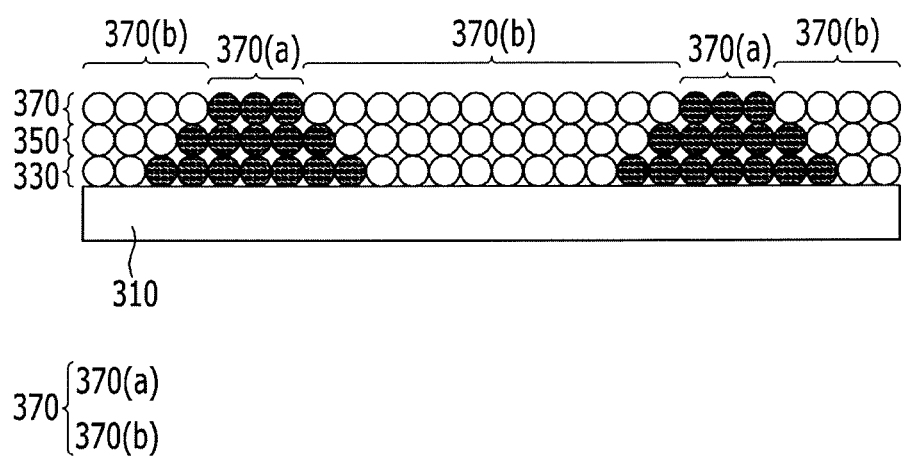

Referring to FIG. 11, the predetermined regions 370(a) which had been irradiated are cured, and the other regions 370(b) which have not been irradiated are not cured.

Figure 12:
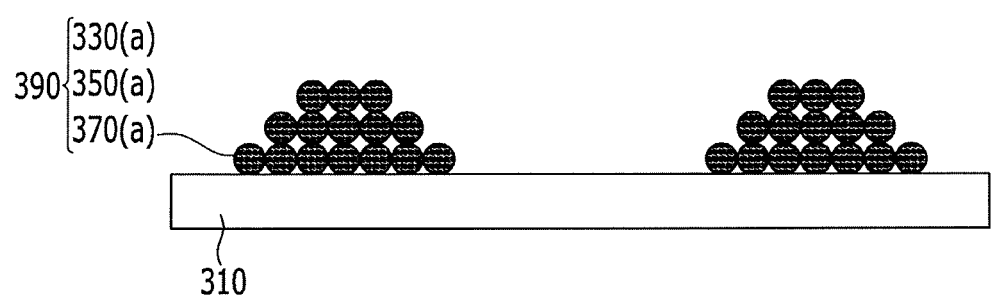

Thereafter, when the process of curing the light blocking layers 330, 350, and 370 is completed, the other regions 330(b), 350(b), and 370(b) of the light blocking layers are removed as illustrated in FIG. 12.

Referring to FIG. 12, when other regions 330(b), 350(b), and 370(b) of the light blocking layers are removed, only the predetermined regions 330(a), 350(a), and 370(a) of the light blocking layer remain on the support plate 310.

The remaining predetermined regions 330(a), 350(a), and 370(a) of the light blocking layer correspond to the mask pattern of the photo mask.

Here, the process of removing the light blocking layer is performed as a process of removing the powdery light blocking material. For example, the powdery light blocking material may be removed by jetting air to the support plate 310. Alternatively, the support plate 310 may be turned over, and air may be jetted to the other regions 330(b), 350(b), and 370(b) of the light blocking layer to remove the powdery light blocking material. Thereafter, predetermined regions 330(a), 350(a), and 370(a) may be cleaned or dried.

Here, the separated powdery light blocking material may be collected and recycled as a light blocking material for forming a light blocking layer.

According to an exemplary embodiment of the present invention, a passivation layer (not shown) may be formed on the support plate 310 before the formation of the light blocking layer 330.

Here, the passivation layer may prevent the support plate 310 from being damaged by heat generated when the light blocking layers 330, 350, and 370 are cured. In detail, the passivation layer may prevent heat generated, when the light blocking layers 330, 350, and 370 are cured, from being transmitted to the support plate 310. Here, the passivation layer may be formed of a silicon nitride (SiNx) layer, a silicon oxide ($SiO_2$) layer, or a silicon oxynitride (SiOxNY) layer.

After the mask patterns 330(a), 350(a), and 370(a) are formed on the support plate 310 through the foregoing process, a process of inspecting the mask pattern or a process of forming an overcoat to cover the mask pattern may be additionally performed.

Hereinafter, a method for manufacturing a mask according to an exemplary embodiment of the present invention will be described. In describing the method for manufacturing a mask according to an exemplary embodiment of the present invention, detailed descriptions of processes the same as similar to those of the method for manufacturing a mask according to the former exemplary embodiment described above may be omitted.

Figure 13:
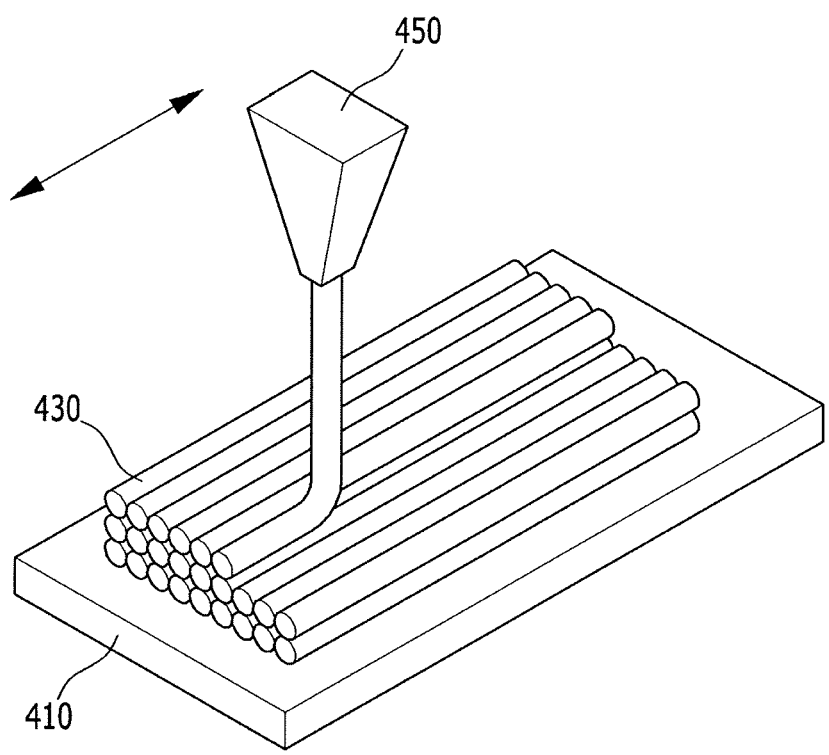
FIG. 13 is a schematic diagram illustrating a method of manufacturing a mask according to an exemplary embodiment of the present invention.

Referring to FIG. 13, first, a support plate 410 is prepared. The support plate 410 supports a mask pattern and allows light, which has passed through the mask pattern, to be selectively transmitted therethrough.

Thus, the support plate 410 may be light-transmissive. For example, the support plate 410 may be formed of quartz, or the like. However, a material used to form the support plate 410 is not limited thereto and the support plate 410 may be formed of various known materials used to form a light-transmissive support plate of a photo mask.

Next, a light blocking material 430 is applied in a predetermined pattern to the support plate 410. As illustrated in FIG. 13, the light blocking material is supplied from a supply unit 450 and thinly stacked on the support plate 410.

Here, the light blocking material 430 may be an organic material including chromium (Cr), a chromium oxide, or carbon. However, the light blocking material 430 is not limited thereto and various known materials used as a light blocking material of a photo mask may be used.

Thereafter, the light blocking material is cured using a light source (not shown) or an electronic beam. Here, a laser or an electronic beam may be used to perform curing of the light blocking material 430. However, the light source is not limited to a laser and various known light sources capable of curing the light blocking material may be used.

According to an exemplary embodiment of the present invention, the process of applying the light blocking material and the process of curing the light blocking material are repeatedly performed. For example, the process of applying the light blocking material with a predetermined pattern, curing the applied light blocking material, and applying the light blocking material with a predetermined pattern, and curing the applied light blocking material is repeated.

Unlike the previous approach described above, here, the light blocking material 430 is applied with a predetermined pattern. For example, in the approach described above, the light blocking material is applied to the entire surface of the support plate 310, while here, the light blocking material 430 is applied with a predetermined pattern, for example, a mask pattern of a photo mask.

According to a method of manufacturing a mask according to an exemplary embodiment of the present invention, the process of removing a light blocking material, such as that performed in the previous exemplary embodiment, may be omitted. For example, in the previously described approach, the process of removing the uncured light blocking material is required, but here, the process of removing an uncured light blocking material may be omitted.

Figure 14:
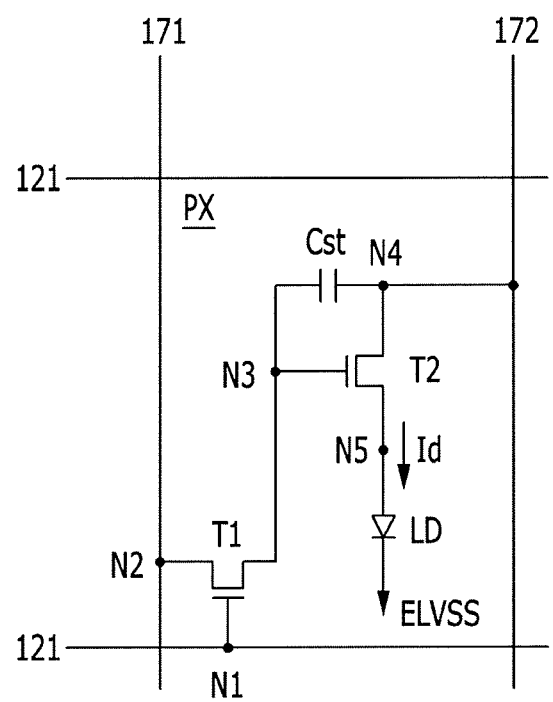
FIG. 14 is an equivalent circuit diagram of a pixel of an organic light emitting display device in accordance with exemplary embodiments of the present invention.
Figure 15:
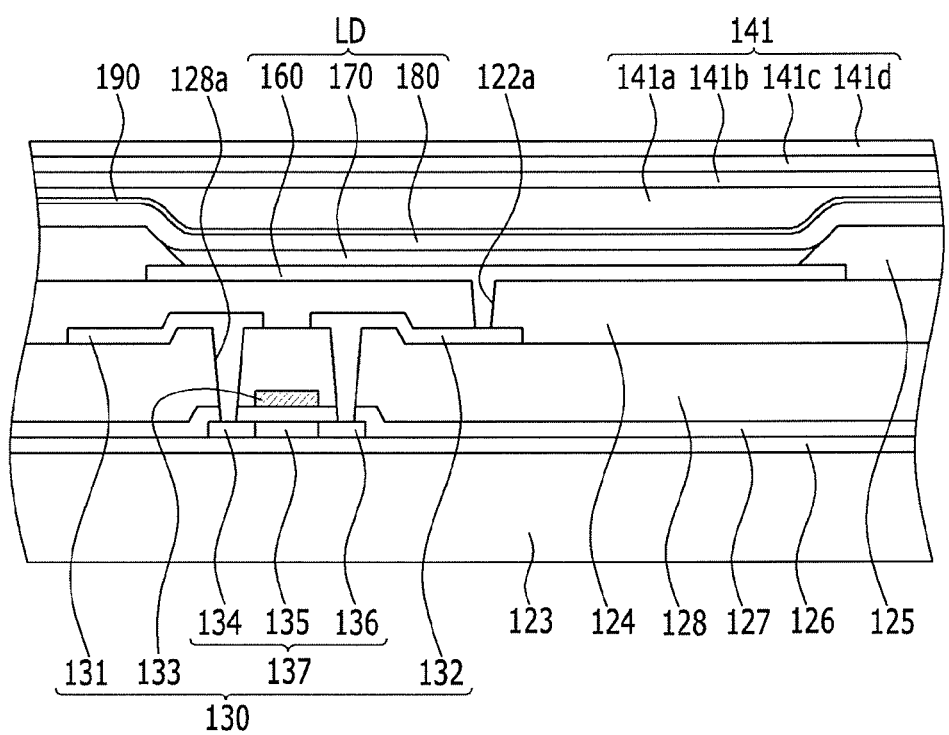
FIG. 15 is a cross-sectional view of an organic light emitting display device in accordance with exemplary embodiments of the present invention.

FIG. 14 is an equivalent circuit diagram of a pixel of an organic light emitting display device, and FIG. 15 is a cross-sectional view of an organic light emitting display device. FIGS. 16 through 20 are views illustrating a sequential process of a method of manufacturing a display device according to an exemplary embodiment of the present invention.

Hereinafter, a method of manufacturing a display device according to an exemplary embodiment will be described with reference to FIGS. 16 through 20.

First, a display device manufacturing through a manufacturing method according to an exemplary embodiment will be described with reference to FIGS. 14 and 15.

The display device described with reference to FIGS. 14 and 15 relates to an organic light emitting display device.

However, the display device according to an exemplary embodiment is not limited thereto and the present invention may also be applied to a liquid crystal display (LCD), a plasma display panel (PDP), a field effect display (FED), an electrophoretic display device, and the like.

Referring to FIG. 14, the organic light emitting display device includes a plurality of signal lines 121, 171, and 172, and a pixel PX connected thereto. The pixel PX may be a red pixel (R), a green pixel (G), or a blue pixel (B).

The signal lines may include a scanning signal line 121 transferring a gate signal (or a scan signal), a data line 171 transferring a data signal, a driving voltage line 172 transferring a driving voltage, and the like. The scanning signal lines 121 extend substantially in a row direction and substantially parallel to each other, and the data lines 171 extend in a substantially column direction and substantially parallel to each other. The driving voltage line 172 is illustrated as extending substantially in a column direction, but it may also extend in the row direction or in the column direction or may be formed to have a net shape, for example, being disposed in both a row direction and a column direction.

Here, one pixel PX includes a thin film transistor (TFT) including a switching transistor T1 and a driving transistor T2, a storage capacitor Cst, and an organic light emitting element LD. Although not shown, one pixel PX may further include an additional TFT and an additional storage capacitor to compensate for a current provided to the organic light emitting element LD.

The switching transistor T1 includes a control terminal N1, an input terminal N2, and an output terminal N3. The control terminal N1 is connected to the scanning signal line 121, the input terminal N2 is connected to the data line 171, and the output terminal N3 is connected to the driving transistor T2. In response to a scan signal received from the scanning signal line 121, the switching transistor T1 transfers a data signal received from the data line 171 to the driving transistor T2.

The driving transistor T2 also includes a control terminal N3, an input terminal N4, and an output terminal N5. The control terminal N3 is connected to the switching transistor T1, the input terminal N4 is connected to the driving voltage line 172, and the output terminal N5 is connected to the organic light emitting element LD. The driving transistor T2 applies an output current Id varied in magnitude according to voltages applied between the control terminal N3 and the output terminal N5.

Here, the storage capacitor Cst is connected between the control terminal N3 and the input terminal N4 of the driving transistor T2. The storage capacitor Cst charges a data signal applied to the control terminal N3 of the driving transistor T2 and maintains the stored data signal even after the switching transistor T1 is turned off.

The organic light emitting element LD, for example, an organic light emitting diode (OLED), may include an anode connected to the output terminal N5 of the driving transistor T2 and a cathode connected to a common voltage Vss. The organic light emitting element LD may emit light with strength varied according to the output current Id from the driving transistor T2 to display an image.

The organic light emitting element LD may include an organic material uniquely emitting one or more of primary colors such as red, green, and blue colors, and the organic light emitting display device displays a desired image by the spatial sum of these colors.

The switching transistor T1 and the driving transistor T2 are n-channel field effect transistors (FETs), but here, at least one of them may be a p-channel FET. Also, connection relationships of the transistors T1 and T2, the storage capacitor Cst, and the organic light emitting element LD may be changed.

Hereinafter, the organic light emitting display device will be described with reference to the cross-sectional view of FIG. 15.

Referring to FIG. 15, a substrate 123 may be formed as an insulating substrate formed of glass, quartz, ceramic, plastic, and the like. The substrate 123 may be flexible. Here, the substrate 123 may correspond to a substrate 710 of FIG. 16.

A substrate buffer layer 126 is formed on the substrate 123. The substrate buffer layer 126 serves to prevent penetration of impurities into the substrate and to planarize a surface of the substrate.

Here, the substrate buffer layer 126 may be formed of various materials capable of performing the foregoing function. For example, as the substrate buffer layer 126 may include silicon nitride (SiNx), silicon oxide ($SiO_2$), and/or a silicon oxynitride (SiOxNy). However, the substrate buffer layer 126 is not an essential component and may be omitted depending on a type of the substrate 123 and process conditions used.

A driving semiconductor layer 137 is formed on the substrate buffer layer 126. The driving semiconductor layer 137 is formed as a polysilicon film. The driving semiconductor layer 137 includes a channel region 135 in which an impurity is not doped, a source region 134 and a drain region 136 formed on both side of the channel region 135, the source region 134 and the drain region 136 being doped with an impurity. Here, a doped ion material may be a P-type impurity such as boron (B) and $B_2H_6$. Here, the impurity may be varied according to types of TFTs.

A gate insulating layer 127 formed of silicon nitride (SiNx) or silicon oxide ($SiO_2$) is formed on the driving semiconductor layer 137. A gate line including a driving gate electrode 133 is formed on the gate insulating layer 127. The driving gate electrode 133 is formed to overlap at least a portion of the driving semiconductor layer 137, for example, the channel region 135.

An interlayer insulating layer 128 covering the driving gate electrode 133 is formed on the gate insulating layer 127. A contact hole 128a exposing the source region 134 and the drain region 136 of the driving semiconductor layer 137 is formed in the gate insulating layer 127 and the interlayer insulating layer 128. Like the gate insulating layer 127, the interlayer insulating layer 128 may be formed of a ceramic-based material such as silicon nitride (SiNx) or silicon oxide ($SiO_2$).

A data line including a driving source electrode 131 and a driving drain electrode 132 is formed on the interlayer insulating layer 128. The driving source electrode 131 and the driving drain electrode 132 are connected to the source region 134 and the drain region 136 of the driving semiconductor layer 137 through the contact hole 128a formed in the interlayer insulating layer 128 and the gate insulating layer 127, respectively.

In this manner, the driving TFT 130 including the driving semiconductor layer 137, the driving gate electrode 133, the driving source electrode 131, the driving drain electrode 132 is formed. The configuration of the driving TFT 130 is not limited to the foregoing example and may be variously modified.

A planarization layer 124 covering the data line is formed on the interlayer insulating layer 128. The planarization layer 124 serves to remove a step and planarize a surface to enhance luminous efficiency of the organic light emitting element to be formed thereon. Also, the planarization layer 124 includes an electrode via hole 122a exposing a portion of the drain electrode 132.

The planarization layer 124 may include an acryl-based resin (polyacrylate resin), an epoxy resin, a phenolic resin, a polyamide resin, a polyimide resin, an unsaturated polyester resin, a poly phenylenether resin, a poly phenylenesulfide resin, and/or benzocyclobutene (BCB).

Here, an exemplary embodiment is not limited to the foregoing structure, and any one of the planarization layer 124 and the interlayer insulating layer 128 may be omitted according to circumstances.

Here, a first electrode, e.g., a pixel electrode 160, of the organic light emitting element, is formed on the planarization layer 124. For example, the organic light emitting display device includes a plurality of pixel electrodes 160 respectively disposed in a plurality of pixels. Here, the plurality of pixel electrodes 160 are disposed to be spaced apart from one another. The pixel electrode 160 is connected to the drain electrode 132 through the electrode via hole 122a of the planarization layer 124.

A pixel defining layer 125 having an opening exposing the pixel electrode 160 is formed on the planarization layer 124. For example, the pixel defining layer 125 has a plurality of openings respectively formed in pixels. Here, an organic light emitting layer 170 may be formed in each opening formed by the pixel defining layer 125. Thus, each pixel region in which the organic light emitting layer is formed may be defined by the pixel defining layer 125.

Here, the pixel electrode 160 is disposed to correspond to the opening of the pixel defining layer 125. However, the pixel electrode 160 may not necessarily be disposed only in the opening of the pixel defining layer 125 and may be disposed below the pixel defining layer 125 such that a portion thereof overlaps the pixel defining layer 125.

The pixel defining layer 125 may be formed of resins such as a polyacrylate resin and a polyimide resin, or a silica-based inorganic material.

An organic light emitting layer 170 is formed on the pixel electrode 160.

A second electrode, e.g., a common electrode 180, may be formed on the organic light emitting layer 170. In this manner, the organic light emitting element LD including the pixel electrode 160, the organic light emitting layer 170, and the common electrode 180 is formed.

Here, the pixel electrode 160 and the common electrode 180 may be formed of a transparent conductive material or a semi-transparent or a reflective conductive material. Depending on a type of a material used to form the pixel electrode 160 and the common electrode 180, the organic light emitting display device may be a top emission-type organic light emitting display device, a bottom emission-type organic light emitting display device, or a dual-emission-type organic light emitting display device.

An overcoat 190 covering and protecting the common electrode 180 may be formed as an organic layer on the common electrode 180.

A thin film encapsulation layer 141 is formed on the overcoat 190. The thin film encapsulation layer 141 seals the organic light emitting element LD and the driving circuit unit formed on the substrate 123 from the outside to protect the organic light emitting element LD and the driving circuit unit.

The thin film encapsulation layer 141 includes encapsulation organic layers 141a and 141c and encapsulation inorganic layers 141b and 141d which are alternately stacked. In FIG. 15, a case where two encapsulation organic layers 141a and 141c and two encapsulation inorganic layers 141b and 141d are alternately stacked to form the thin film encapsulation layer 141 is illustrated, but the present invention is not limited thereto.

A window (not shown) for protecting the organic light emitting element, or the like, may be disposed on the thin film encapsulation layer 141.

Hereinafter, a method for manufacturing a display device according to an exemplary embodiment of the present invention will be described with reference to FIGS. 16 through 20. This method includes a process for forming lines of the display device.

As described above, the gate line or the data line is formed on an insulating layer in the display device. The gate line is formed on the gate insulating layer, and the data line is formed on interlayer insulating layer.

Here, the gate line includes a gate electrode, and the data line includes source and drain electrodes. The gate electrode and the source and drain electrodes are formed in a predetermined pattern on the insulating layer.

Hereinafter, the method of forming the gate line or the data line in a predetermined pattern will be described in detail.

Figure 16:
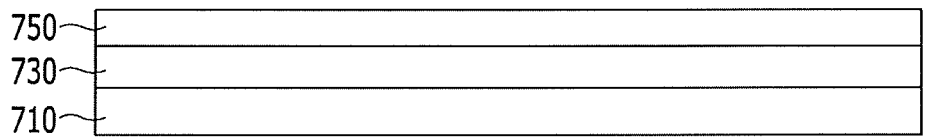
FIGS. 16 through 20 are schematic diagrams illustrating a sequential process of a method of manufacturing a display device according to an exemplary embodiment of the present invention.

First, referring to FIG. 16, a substrate 710 is prepared. Here, the substrate 710 corresponds to the substrate 123 of FIG. 15. Next, an insulating layer 730 is formed on the substrate 710.

Here, the insulating layer 730 may be the gate insulating layer 127 or the interlayer insulating layer 128 of FIG. 15.

However, the insulating layer 730 is not limited to the gate insulating layer 127 and the interlayer insulating layer 128, and may correspond to various insulating layers positioned below a metal line.

Thereafter, a metal layer 750 is formed on the insulating layer 730. The metal layer 750 may be formed of a material forming the gate line or the data line described above. For example, the metal layer 750 may be formed of a known material used to form gate or data lines.

Figure 17:
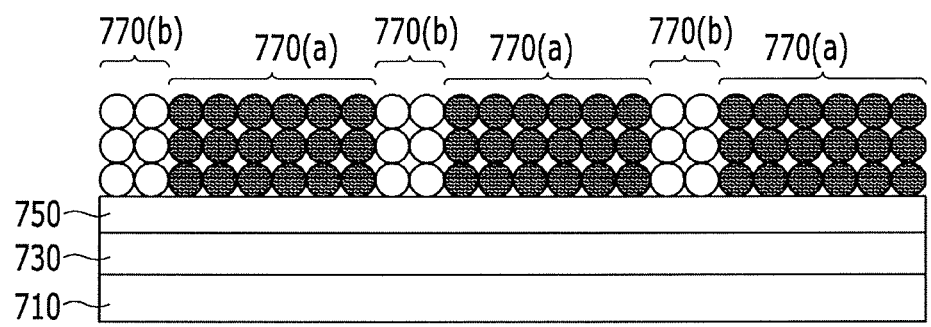

As shown in FIG. 17, thereafter, a process of forming a mask pattern on the metal layer 750 is performed.

In detail, a light blocking layer 770 is formed on the metal layer 750. The light blocking layer 770 is formed by thinly applying an etch-resistant material. Here, the etch-resistant material refers to a material which is not etched by an etching solution.

The process of forming the light blocking layer 770 is similar to the process described above in the method of manufacturing a mask described above.

The etch-resistant material is thinly applied to the metal layer 750 by using a roller or a doctor blade (not shown).

Thereafter, predetermined regions 770(a) of the light blocking layer 770 are cured by using light, such as light provided by a laser 500, or electronic beam source.

A temperature generated by the light source may be varied depending on a melting point of the etch-resistant material forming the light blocking layer.

Here, the predetermined cured regions 770(a) of the light blocking layer may be regions corresponding to a mask pattern. For example, during the process of etching the metal layer 750, the predetermined regions 770(a) correspond to regions preventing the metal layer 750 from being etched.

According to an exemplary embodiment of the present invention, the process of forming the light blocking layer and the process of curing the light blocking layer are repeatedly performed. For example, the process of forming the light blocking layer, curing the predetermined regions, forming the light blocking layer, and curing the predetermined regions is repeatedly performed.

When such a process is repeatedly performed, the light blocking layer-cured regions 770(a) and uncured regions 770(b) are formed as illustrated in FIG. 17.

Figure 18:
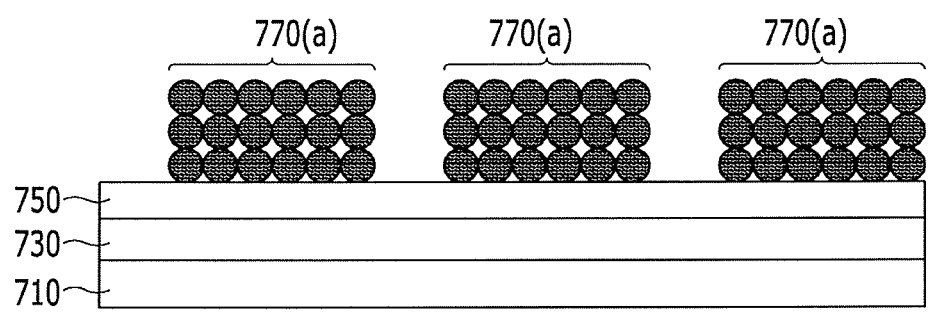

Thereafter, as illustrated in FIG. 18, the other regions 770(b) of the light blocking layer are removed. For example, the uncured regions 770(b) of the light blocking layer are removed.

When the other regions 770(b) of the light blocking layer are removed, only the predetermined regions 770(a) of the light blocking layer remain on the metal layer 750.

The remaining predetermined regions 770(a) of the light blocking layer correspond to a mask pattern of an etch mask.

Here, the process of removing the light blocking layer is performed as a process of removing the powdery etch-resistant material. For example, the powdery etch-resistant material may be removed by jetting air.

Here, the separated powdery etch-resistant material may be collected and recycled as an etch-resistant material for forming a light blocking layer.

As described above, after the predetermined regions 770(a) of the light blocking layer, for example, the mask pattern, is completed on the metal layer 750, the metal layer 750 is etched to expose the insulating layer 730.

Figure 19:
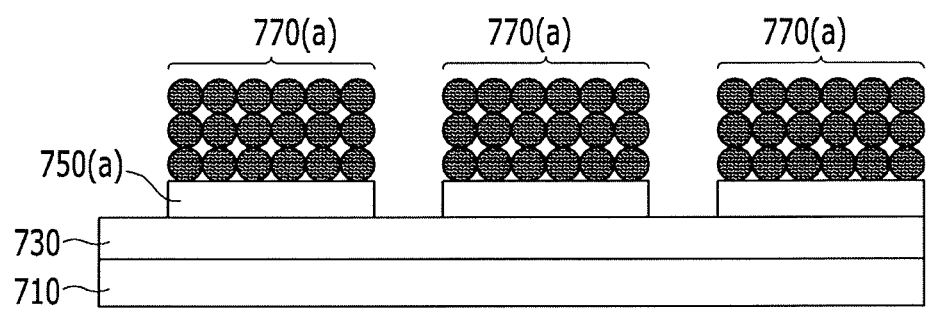
Figure 20:
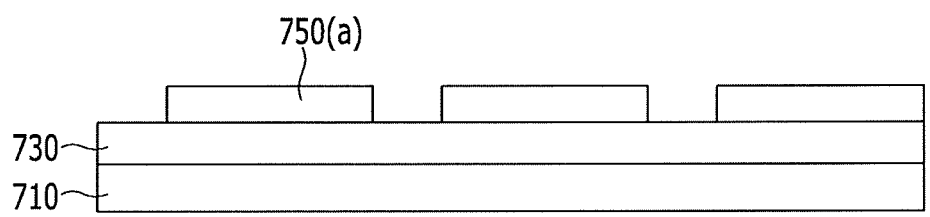

As illustrated in FIG. 19, when an etching process is performed using the predetermined regions 770(a) as a mask pattern, the metal layer 750(a) is etched to a shape corresponding to the mask pattern.

Here, the process of etching the metal layer 750 may be performed by wet etching. Here, as an etching solution used for wet etching, an etching solution for selectively etching only the metal layer, rather than the light blocking layer, may be used.

After the etching process of the metal layer 750 is completed, the light blocking layer 770(a) is removed.

Here, the process of removing the light blocking layer 770(a) may be performed by wet etching, for example. In this case, as an etching solution, an etching solution for selectively etching only the light blocking layer 770(a), rather than the metal layer 750, may be used.

After lines are formed through the foregoing process, an interlayer insulating layer or a planarization layer may be formed on the lines.

According to an exemplary embodiment of the present invention, before the formation of the light blocking layer 770, a passivation layer (not shown) may be formed on the metal layer 750.

Here, the passivation layer may prevent the metal layer 750 from being damaged by heat generated when the light blocking layer 770 is cured. In detail, the passivation layer may prevent heat generated when the light blocking layer 770 is cured from being transmitted to the metal layer 750. Here, the passivation layer may include silicon nitride (SiNx), silicon oxide ($SiO_2$), and/or silicon oxynitride (SiOxNY).

In the method for manufacturing a mask according to an exemplary embodiment of the present invention, the process of thinly forming a light blocking layer and curing the light blocking layer to have a predetermined pattern is repeatedly performed to manufacture a mask. Compared with the related art process of manufacturing a photo mask through photolithography, manufacturing cost may be significantly reduced and manufacturing time and process may be simplified.

Also, in the method for manufacturing a display device according to an exemplary embodiment of the present invention, lines are formed by manufacturing an etch mask through a process of forming a light blocking layer and curing the light blocking layer to have a predetermined pattern, similar to the method of manufacturing a mask. Thus, cost and time required for forming metal lines may be reduced.

While this invention has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. A method of manufacturing a mask, the method comprising:
   providing a support plate;
   forming a first light blocking layer on the support plate of an uncured light blocking material;
   curing a first predetermined region of the first light blocking layer;
   forming a second light blocking layer of the uncured light blocking material on the first light blocking layer;
   curing a second predetermined region of the second light blocking layer; and
   removing all regions of the second light blocking layer that are not the second predetermined region and removing all regions of the first light blocking layer that are not the first predetermined region.

2. The method of claim 1, wherein: the regions of the second light blocking layer that are not the second predetermined region are removed at substantially the same time as the regions of the first light blocking layer that are not the first predetermined region are removed.

3. The method of claim 1, further comprising:
forming a passivation layer on the support plate before the forming of the first light blocking layer,
wherein the passivation layer prevents heat, generated when the first light blocking layer is cured, from being transmitted to the support plate.

4. The method of claim 3, wherein:
the passivation layer includes silicon nitride, silicon oxide, or silicon oxynitride.

5. The method of claim 1, wherein:
in the forming of the first light blocking layer,
the first light blocking layer is formed by applying the uncured light blocking material to the support plate.

6. The method of claim 5, wherein:
the light blocking material is formed of chromium (Cr) or a chromium oxide.

7. The method of claim 5, wherein:
the light blocking material is applied to the support plate by a roller or a doctor blade.

8. The method of claim 1, wherein:
the curing of the first light blocking layer is performed by irradiating the first predetermined region of the first light blocking layer using a laser.

9. The method of claim 1, wherein:
in the removing of all the regions of the first light blocking layer that are not the first predetermined region,
the regions of the light blocking layer that are not the first predetermined region are separated from the first predetermined region of the light blocking layer by jetting air thereupon.

10. The method of claim 1, wherein:
the support plate is light-transmissive.

11. The method of claim 1, wherein forming the first light blocking layer on the support plate includes disposing the uncured light blocking material on the light support plate while the light blocking material is in a powdered form.

12. The method of claim 11, wherein removing the regions of the light blocking layer that are not the predetermined region includes turning the support plate upside down and jetting air on a surface of the light support plate upon which the uncured light blocking material is disposed.

13. The method of claim 12, further including, collecting the uncured powdery light blocking material as it is blown off the surface of the light support plate and reusing the collected light blocking material.

14. A method of manufacturing a mask, the method comprising:
providing a support plate;
selectively applying an uncured light blocking material on the support plate in a predetermined circuit pattern as a plurality of stacked layers; and
curing the light blocking material,
wherein the selectively-applied light blocking material, after being cured, forms the circuit pattern without etching or otherwise removing the light blocking material from the support plate.

15. The method of claim 14, wherein:
the applying of the light blocking material and the curing of the light blocking material are repeatedly and alternately performed.

16. The method of claim 14, wherein:
the light blocking material includes chromium (Cr) or a chromium oxide.

17. A method of manufacturing a display device, the method comprising:
providing a substrate;
forming an insulating layer on the substrate;
forming a metal layer on the insulating layer;
forming a light blocking layer of an uncured light blocking material on the metal layer;
curing a predetermined region of the light blocking layer;
removing all regions of the light blocking layer that are not the predetermined region; and etching the metal layer such that the insulating layer is exposed,
wherein the metal layer is etched using the predetermined region of the light blocking layer as a mask.

18. The method of claim 17, wherein:
the forming of the light blocking layer and the curing of the light blocking layer are repeatedly and alternately performed.

19. The method of claim 18, further comprising:
forming a passivation layer on the metal layer before the forming of the light blocking layer,
wherein the passivation layer prevents heat generated, when the light blocking layer is cured, from being transmitted to the metal layer.

20. The method of claim 19, wherein:
the passivation layer includes silicon nitride, silicon oxide, or silicon oxynitride.

21. The method of claim 17, wherein:
in the forming of the light blocking layer,
the light blocking layer is formed by applying an etch-resistant material to the metal layer.

22. The method of claim 17, wherein:
in the removing of the light blocking layer,
the regions of the light blocking layer that are not the predetermined region are separated from the predetermined region of the light blocking layer by jetting air thereupon.

23. The method of claim 17, further comprising:
removing the predetermined region of the light blocking layer.

* * * * *